US012696526B2

(12) United States Patent
Chiu et al.

(10) Patent No.: US 12,696,526 B2
(45) Date of Patent: Jul. 28, 2026

(54) BIPOLAR JUNCTION TRANSISTOR (BJT) STRUCTURE

(71) Applicant: MEDIATEK INC., Hsinchu City (TW)

(72) Inventors: Shih-Chuan Chiu, Hsinchu City (TW);
Chia-Hsin Hu, Hsinchu City (TW);
Zheng Zeng, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 379 days.

(21) Appl. No.: 18/460,839

(22) Filed: Sep. 5, 2023

(65) Prior Publication Data

US 2024/0128262 A1 Apr. 18, 2024

Related U.S. Application Data

(60) Provisional application No. 63/379,922, filed on Oct. 18, 2022.

(51) Int. Cl.
*H10D 84/60* (2025.01)
*H10D 84/40* (2025.01)

(52) U.S. Cl.
CPC ......... *H10D 84/645* (2025.01); *H10D 84/409* (2025.01); *H10D 84/641* (2025.01)

(58) Field of Classification Search
CPC ... H10D 84/645; H10D 84/641; H10D 84/409
See application file for complete search history.

(56) References Cited

U.S. PATENT DOCUMENTS

| | | | |
|---|---|---|---|
| 11,289,591 B1 * | 3/2022 | Su | H10D 10/60 |
| 2001/0025963 A1 | 10/2001 | Tashiro | |
| 2019/0067461 A1 * | 2/2019 | Pan | H10D 12/411 |

(Continued)

FOREIGN PATENT DOCUMENTS

| | | |
|---|---|---|
| DE | 102016106309 A1 | 10/2016 |
| DE | 102018100001 A1 | 2/2019 |

(Continued)

OTHER PUBLICATIONS

German language office action dated Apr. 29, 2025, issued in application No. DE 10 2023 127 416.3 (English language translation, pp. 1-8 of attachment).

*Primary Examiner* — David Vu
*Assistant Examiner* — Brandon C Fox
(74) *Attorney, Agent, or Firm* — McClure, Qualey & Rodack, LLP

(57) ABSTRACT

Bipolar junction transistor (BJT) structures are provided. First and second well regions are formed over a dielectric layer. A plurality of first and second gate-all-around (GAA) field-effect transistors are formed over a first well region. A plurality of third GAA field-effect transistors are formed over the second well region. Source/drain features of the first and third GAA field-effect transistors and the second well region have a first conductivity type. Source/drain features of the second GAA field-effect transistors and the first well region have a second conductivity type that is different from the first conductivity type. A first PN junction of a first BJT device is formed between the source/drain features of the first GAA field-effect transistors and the first well region, and a second PN junction of the first BJT device is formed between the first well region and the second well region.

18 Claims, 5 Drawing Sheets

(56)         References Cited

U.S. PATENT DOCUMENTS

2020/0105900 A1*   4/2020  Pan ..................... H10D 64/231
2020/0135646 A1    4/2020  Rubin
2021/0249516 A1*   8/2021  Li ......................... H10D 30/62
2021/0296309 A1*   9/2021  Chang ................. H10D 62/184
2022/0254914 A1    8/2022  Toner

FOREIGN PATENT DOCUMENTS

DE        112019004178 T5    6/2021
WO          2017111792 A1    6/2017

* cited by examiner

1

BIPOLAR JUNCTION TRANSISTOR (BJT) STRUCTURE

CROSS REFERENCE TO RELATED APPLICATIONS

This application claims the benefit of U.S. Provisional Application No. 63/379,922, filed Oct. 18, 2022, the entirety of which is incorporated by reference herein.

BACKGROUND OF THE INVENTION

Field of the Invention

The present invention relates to a bipolar junction transistor (BJT), and, in particular, to a BJT structure with lateral BJT devices.

Description of the Related Art

Bipolar junction transistors (BJTs), which can be formed using a CMOS compatible process, are key parts of analog integrated circuits such as band-gap voltage reference circuits. These circuits are often sensitive to the Vbe (base-emitter voltage) value and Vbe mismatch of BJT.

BRIEF SUMMARY OF THE INVENTION

An embodiment of the present invention provides a bipolar junction transistor (BJT) structure. The BJT structure includes a dielectric layer, a first well region formed over the dielectric layer, a second well region formed over the dielectric layer, a plurality of first gate-all-around (GAA) field-effect transistors formed over the first well region, a plurality of second GAA field-effect transistors formed over the first well region, and a plurality of third GAA field-effect transistors formed over the second well region. The second well region is in contact with the first well region. Source/drain features of the first and third GAA field-effect transistors and the second well region have a first conductivity type, and source/drain features of the second GAA field-effect transistors and the first well region have a second conductivity type that is different from the first conductivity type. A first PN junction of a first BJT device is formed between the source/drain features of the first GAA field-effect transistors and the first well region, and a second PN junction of the first BJT device is formed between the first well region and the second well region.

Furthermore, an embodiment of the present invention provides a BJT structure. The BJT structure includes a dielectric layer, a first well region formed over the dielectric layer, a second well region formed over the dielectric layer, a third well region formed over the dielectric layer, a plurality of first gate-all-around (GAA) field-effect transistors formed over the first well region, a plurality of second GAA field-effect transistors formed over the second well region, and a plurality of third GAA field-effect transistors formed over the third well region. The second well region is disposed between the first and third well regions. Source/drain features of the first GAA field-effect transistors are electrically connected together. Source/drain features of the second GAA field-effect transistors are electrically connected together. Source/drain features of the third GAA field-effect transistors are electrically connected together. The source/drain features of the first and third GAA field-effect transistors and the first and third well regions have a first conductivity type, and the source/drain features of the second GAA field-effect transistors and the second well region have a second conductivity type that is different from the first conductivity type. A first PN junction of a first BJT device is formed between the first and second well regions, and a second PN junction of the first BJT device is formed between the second and third well regions.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures.

Advanced integrated circuit (IC) devices have become increasingly multifunctional and have been scaled down in size. Although the scaling down process generally increases production efficiency and lowers the associated costs, it has also increased the complexity of processing and manufacturing IC devices. For example, Fin Field-Effect Transistors (FinFETs) have been introduced to replace planar transistors. Among these FinFETs, gate-all-around (GAA) structures such as nanosheet or nanowire metal-oxide-semiconductor field-effect transistors (MOSFET) have been developed to possess excellent electrical characteristics, such as better power performance and area scaling compared to the current FinFET technologies. Furthermore, back-side power technology is used in GAA structures to decrease front-side routing, so as to decrease back end of line (BEOL) capacitance and IR drop, thereby improving performance of IC.

Figure 1:
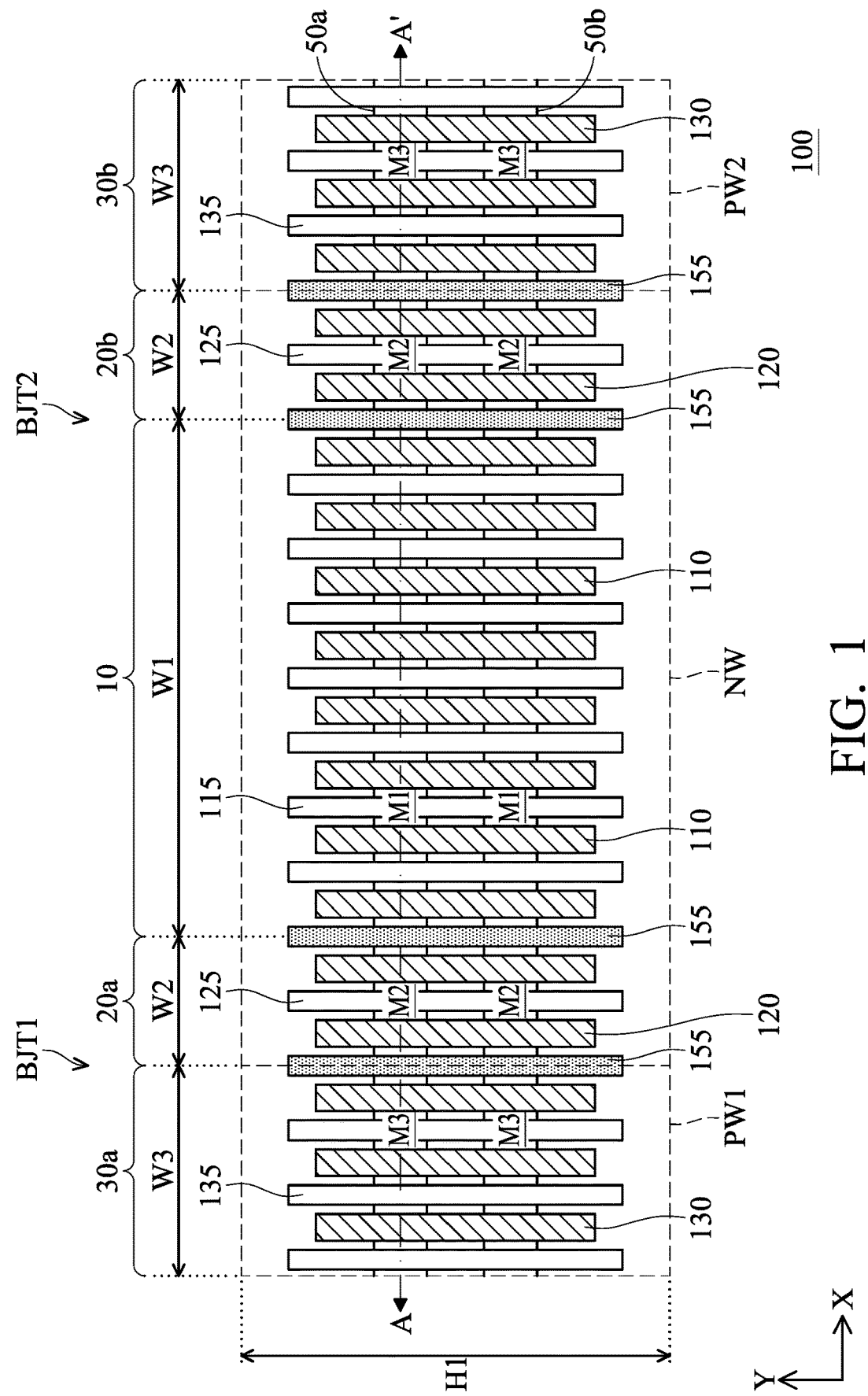
FIG. 1 shows a top view of a bipolar junction transistor (BJT) structure according to some embodiments of the invention.

FIG. 1 shows a top view of a bipolar junction transistor (BJT) structure 100 according to some embodiments of the invention. The BJT structure 100 is a symmetrical structure including the lateral PNP BJT devices BJT1 and BJT2. The BJT device BJT1 is formed in a first device region 10, a second device region 20a and a third device region 30a, and the BJT device BJT2 is formed in the first device region 10, a second device region 20b and a third device region 30b.

The second device regions 20a and 20b and the first device region 10 are formed over the N-type well region NW, and the third device regions 30a and 30b are formed over the P-type well regions PW1 and PW2, respectively. The N-type well region NW is in contact with the P-type well regions PW1 and PW2. The first device region 10, the second device regions 20a and 20b and the third device regions 30a and 30b are arranged in the same row. The second device region 20a is disposed between the first device region 10 and the third device region 30a, and the second device region 20b is disposed between the first device region 10 and the third device region 30b. In the Y-direction, the first device region 10, the second device regions 20a and 20b and the third device regions 30a and 30b have the same height H1. In the X-direction, the first device region 10 has the weight W1, the second device regions 20a and 20b have the same weight W2, and the third device regions 30a and 30b have the same weight W3. In FIG. 1, the weight W3 is greater than the weight W2 and less than the weight W1, i.e., W2<W3<W1. In some embodiments, the weight W1 is greater than twice the weight W2 or W3.

The oxide definition (OD) regions 50a and 50b extend in the X-direction. The OD regions 50a and 50b, sometimes labeled as an "oxide diffusion" area, define the active regions for the transistors M1, M2 and M3, i.e., the regions where the source, drain and channel under the gate of transistors M1, M2 and M3 are formed. The active region is defined to be between inactive areas, such as shallow trench isolation (STI) or field oxide (FOX) region. Furthermore, the transistors M1, M2 and M3 are arranged in a line along in X-direction, and the transistors M2 are disposed between the transistors M1 and the transistors M3. In some embodiments, the transistors M1 are P-type gate-all-around (GAA) field-effect transistors and formed in the first device region 10. The transistors M2 are N-type GAA field-effect transistors and formed in the second device regions 20a and 20b. The transistors M3 are P-type GAA field-effect transistors and formed in the third device regions 30a and 30b. In some embodiments, the number of transistors M1 is greater than the number of transistors M3, and the number of transistors M3 is greater than the number of transistors M2.

In the BJT structure 100, the transistors M1 have gate structures 115 extending in the Y-direction, and sources and drains of the transistors M1 are electrically connected together through the connecting features 110 and an interconnect structure (not shown) over the BJT structure 100. The transistors M2 have gate structures 125 extending in the Y-direction, and sources and drains of the transistors M2 are electrically connected together through the connecting features 120 and an interconnect structure (not shown) over the BJT structure 100. The transistors M3 have gate structures 135 extending in the Y-direction, and sources and drains of the transistors M3 are electrically connected together through the connecting features 130 and an interconnect structure (not shown) over the BJT structure 100. The connecting features 110, 120 and 130 are formed in the same level. In some embodiments, the connecting features 110, 120 and 130 are electrodes (e.g., metal line or conductive material) that are in directly contact with the source/drain features of the transistors M1, M2 and M3, respectively.

In some embodiments, gates (e.g., the gate structures) of the transistors M1, M2 and M3 are floating. In some embodiments, the gates, sources and drains (e.g., source/drain features) of the transistors M1 are electrically connected together, the gates, sources and drains of the transistors M2 are electrically connected together, and the gates, sources and drains of the transistors M3 are electrically connected together. In some embodiments, the gates of the transistors M1 are electrically connected to the sources and drains of the transistors M2.

Figure 2:
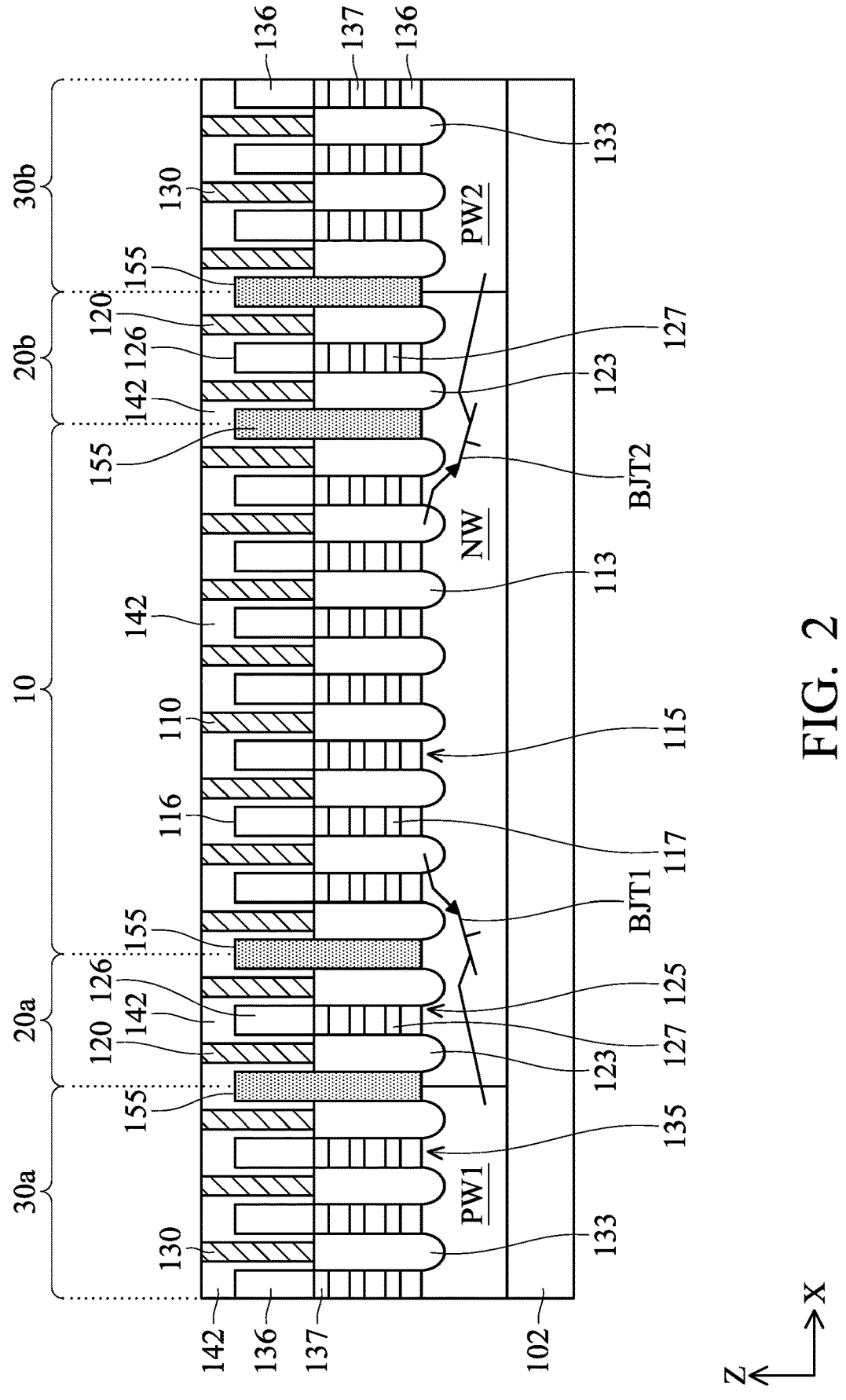
FIG. 2 shows a cross-sectional view of the BJT structure along line A-A' of FIG. 1 according to some embodiments of the invention.

FIG. 2 shows a cross-sectional view of the BJT structure 100 along line A-A' of FIG. 1 according to some embodiments of the invention. The P-type well regions PW1 and PW2 and the N-type well region NW are formed over a dielectric layer 102. The P-type well region PW1 is separated from the P-type well region PW2 by the N-type well region NW. In some embodiments, the dielectric layer 102 includes Oxide, the P-type well regions PW1 and PW2 include boron-doped silicon (SiB), and the N-type well region NW includes phosphorous-doped silicon (SiP). The dielectric layer 102 is formed by removing a substrate (e.g., Si) with a suitable process (e.g., a chemical mechanical polishing (CMP) process) after the transistors M1, M2 and M3 are formed.

The transistors M3 are formed over the P-type well regions PW1 and PW2. The gate structures 135 of the transistor M3 include the gate electrodes 136 and the nanostructures 137. In order to simplify, detail of the gate structures in FIG. 2, such as the gate dielectric layer, the space and so on, will be omitted. The gate dielectric layer (not shown) wraps around the nanostructures 137 and the gate electrode 136 wraps around the gate dielectric layer. The gate electrode 136 may include polysilicon or work function metal (not shown). The work function metal includes TiN, TaN, TiAl, TiAlN, TaAl, TaAlN, TaAlC, TaCN, WNC, Co, Ni, Pt, W, combinations thereof, or other suitable material. The nanostructures 137 extend in the X-direction and vertically arranged (or stacked) in the Z-direction. More specifically, the nanostructures 137 are spaced from each other in the Z-direction. The nanostructures 137 may also be referred to as channels, channel layers, nanosheets, or nanowires. The nanostructures 137 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP.

The source/drain features 133 of the transistors M3 are formed by epitaxially-grown materials. Two source/drain features 133 are on opposite sides of the gate structure 135. In some embodiments, the epitaxially-grown materials of the source/drain features 133 may include the materials with P-type conductivity, such as SiGe, SiGeC, Ge, Si, boron-doped SiGe, gallium-doped SiGe, boron and gallium doped SiGe, boron and carbon doped SiGe, or a combination thereof.

The connecting features 130 are formed in the dielectric feature 142 and are formed over and in contact with the source/drain features 133. The source/drain features 133 of the transistors M3 are electrically connected together through the connecting features 130 and an interconnect structure (not shown). The connecting features 130 are separated from each other by the dielectric feature 142. The dielectric feature 142 may be an inter-layer dielectric (ILD). The dielectric feature 142 may include one or more dielectric layers including dielectric materials, such as tetraethyl-orthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or a combination thereof.

The transistors M2 are formed over the N-type well region NW. The gate structures 125 of the transistor M2 include the gate electrodes 126 and the nanostructures 127. The gate dielectric layer (not shown) wraps around the nanostructures 127 and the gate electrode 126 wraps around the gate dielectric layer. The gate electrode 126 may include polysilicon or work function metal (not shown). The nano-structures 127 extend in the X-direction and vertically arranged (or stacked) in the Z-direction. More specifically, the nanostructures 127 are spaced from each other in the Z-direction. The nanostructures 127 may also be referred to as channels, channel layers, nanosheets, or nanowires. The nanostructures 127 may include a semiconductor material, such as silicon, germanium, silicon carbide, silicon phos-phide, gallium arsenide, gallium phosphide, indium phos-phide, indium arsenide, and/or indium antimonide, silicon germanium (SiGe), SiPC, GaAsP, AlInAs, AlGaAs, GaInAs, GaInP, and/or GaInAsP.

The source/drain features 123 of the transistors M2 are formed by epitaxially-grown materials. Two source/drain features 123 are on opposite sides of the gate structure 125. In some embodiments, the epitaxially-grown materials of the source/drain features 123 may include the materials with N-type conductivity, such as SiP, SiC, SiPC, SiAs, Si, antimony-doped SiP (SiP:Sb), antimony-doped SiAs (SiAs:Sb), or a combination thereof.

The connecting features 120 are formed in the dielectric feature 142 and are formed over and in contact with the source/drain features 123. The source/drain features 123 of the transistors M2 are electrically connected together through the connecting features 120 and an interconnect structure (not shown). The connecting features 120 are separated from each other by the dielectric feature 142.

The transistors M1 are formed over the N-type well regions NW. The gate structures 115 of the transistor M1 include the gate electrodes 116 and the nanostructures 117. The gate dielectric layer (not shown) wraps around the nanostructures 117 and the gate electrode 116 wraps around the gate dielectric layer. The gate electrode 116 may include polysilicon or work function metal (not shown). The nano-structures 117 extend in the X-direction and vertically arranged (or stacked) in the Z-direction. More specifically, the nanostructures 117 are spaced from each other in the Z-direction. The nanostructures 117 may also be referred to as channels, channel layers, nanosheets, or nanowires. The nanostructures 117 may include a semiconductor material, such as silicon, germanium, silicon carbide, silicon phos-phide, gallium arsenide, gallium phosphide, indium phos-phide, indium arsenide, and/or indium antimonide, silicon germanium (SiGe), SiPC, GaAsP, AlInAs, AlGaAs, GaInAs, GaInP, and/or GaInAsP.

The source/drain features 113 of the transistors M1 are formed by epitaxially-grown materials. Two source/drain features 113 are on opposite sides of the gate structure 115. In some embodiments, the epitaxially-grown materials of the source/drain features 113 may include the materials with P-type conductivity, such as SiGe, SiGeC, Ge, Si, boron-doped SiGe, gallium-doped SiGe, boron and gallium doped SiGe, boron and carbon doped SiGe, or a combination thereof.

The connecting features 110 are formed in the dielectric feature 142 and are formed over and in contact with the source/drain features 113. The source/drain features 113 of the transistors M1 are electrically connected together through the connecting features 110 and an interconnect structure (not shown). The connecting features 110 are separated from each other by the dielectric feature 142.

In FIG. 2, the transistors M1 are separated from the transistors M2 by the dielectric-base gate structures 155 overlapping the N-type well region NW. The transistors M2 are separated from the transistors M3 by the dielectric-base gate structures 155 overlapping the interface between the P-type well region PW1/PW2 and the N-type well region NW. The dielectric-base gate structures 155 are continuous poly on diffusion edge (CPODE) and includes SiN, SiCON, SiC, SiCN and so on. In some embodiments, the gate electrodes 116, 126 and 136 are formed by the same con-ductive material, such as TiN, TiAl, W and so on. Further-more, the connecting features 110, 120 and 130 are formed by the same conductive material, such as Co, W, Ru and so on.

In the BJT structure 100, the emitter region of the BJT device BJT1 is formed by the source/drain features 113 in the first device region 10, the base region of the BJT device BJT1 is formed by the N-type well region NW, and the collector region of the BJT device BJT1 is formed by the P-type well region PW1. One PN junction of the BJT device BJT1 is formed between the source/drain features 113 and the N-type well region NW, and another PN junction of the BJT device BJT1 is formed between the N-type well region NW and the P-type well region PW1.

The emitter region of the BJT device BJT2 is formed by the source/drain features 113 in the first device region 10, the base region of the BJT device BJT2 is formed by the N-type well region NW, and the collector region of the BJT device BJT2 is formed by the P-type well region PW2. One PN junction of the BJT device BJT2 is formed between the source/drain features 113 and the N-type well region NW, and another PN junction of the BJT device BJT2 is formed between the N-type well region NW and the P-type well region PW2.

In FIG. 2, the emitter regions of the BJT devices BJT1 and BJT2 are simultaneously coupled to the corresponding cir-cuit through the connecting features 110 and a first front-side interconnect structure (not shown). The base regions of the BJT devices BJT1 and BJT2 are simultaneously coupled to the corresponding circuit through the connecting features 120 and a second front-side interconnect structure (not shown). The collector regions of the BJT devices BJT1 and BJT2 are simultaneously coupled to the corresponding cir-cuit through the connecting features 130 and a third front-side interconnect structure (not shown).

There are two basic types of bipolar transistor structures, PNP and NPN, which basically describe the physical arrangement of the P-type and N-type semiconductor mate-rials from which they are made. In the embodiment, the BJT devices BJT1 and BJT2 are the PNP-type BJT device. In some embodiments, the BJT devices BJT1 and BJT2 may be the NPN-type BJT device by modifying the semiconductor materials and adding the required semiconductor layer in the BJT structure 100.

Figure 3:
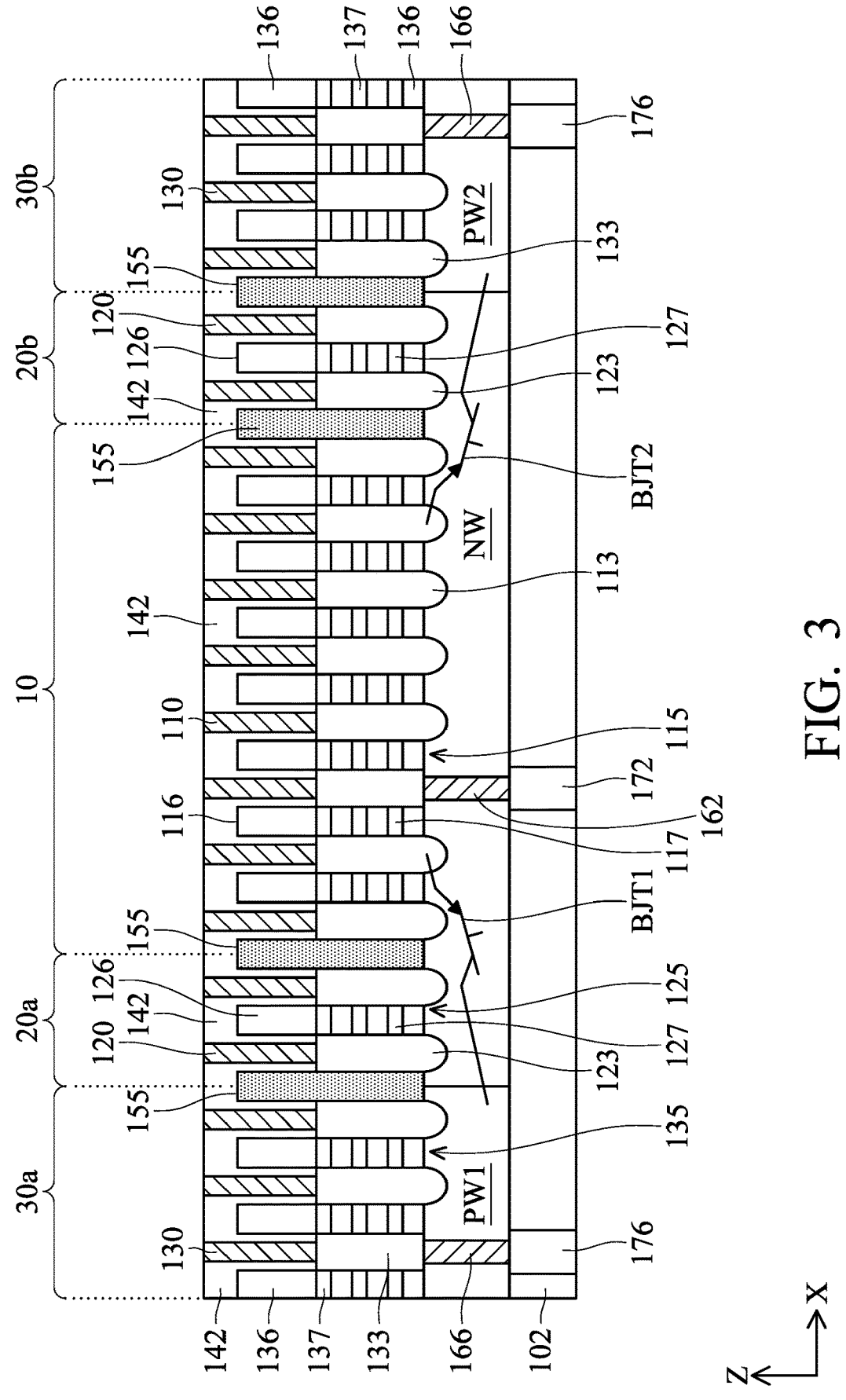
FIG. 3 shows another cross-sectional view of the BJT structure along line A-A' of FIG. 1 according to some embodiments of the invention.

FIG. 3 shows another cross-sectional view of the BJT structure 100 along line A-A' of FIG. 1 according to some embodiments of the invention. Compared with the configu-ration of the BJT structure 100 in FIG. 2, the BJT devices BJT1 and BJT2 are further electrically connected to the corresponding circuits through the back-side interconnect structures (not shown).

In FIG. 3, the emitter regions of the BJT devices BJT1 and BJT2 are further electrically connected to the corresponding circuit through the connecting features 162 and 172 and the corresponding back-side interconnect structure (not shown), and the collector regions of the BJT devices BJT1 and BJT2 are further electrically connected to the corresponding circuit through the connecting features 166 and 176 and the corresponding back-side interconnect structure (not shown). Similarly, the base regions of the BJT devices BJT1 and BJT2 are further electrically connected to the corresponding circuit through the corresponding connecting features (not shown) and the corresponding back-side interconnect structure (not shown). The connecting features 162 are formed in the N-type well region NW, the connecting features 166 are formed in the P-type well region PW1/PW2, and the connecting feature 172 and 176 are formed in the dielectric layer 102. The number of connecting features 162 and 166 and the number of connecting features 172 and 176 are used as an example and are not intended to limit the BJT structure 100.

Figure 4:
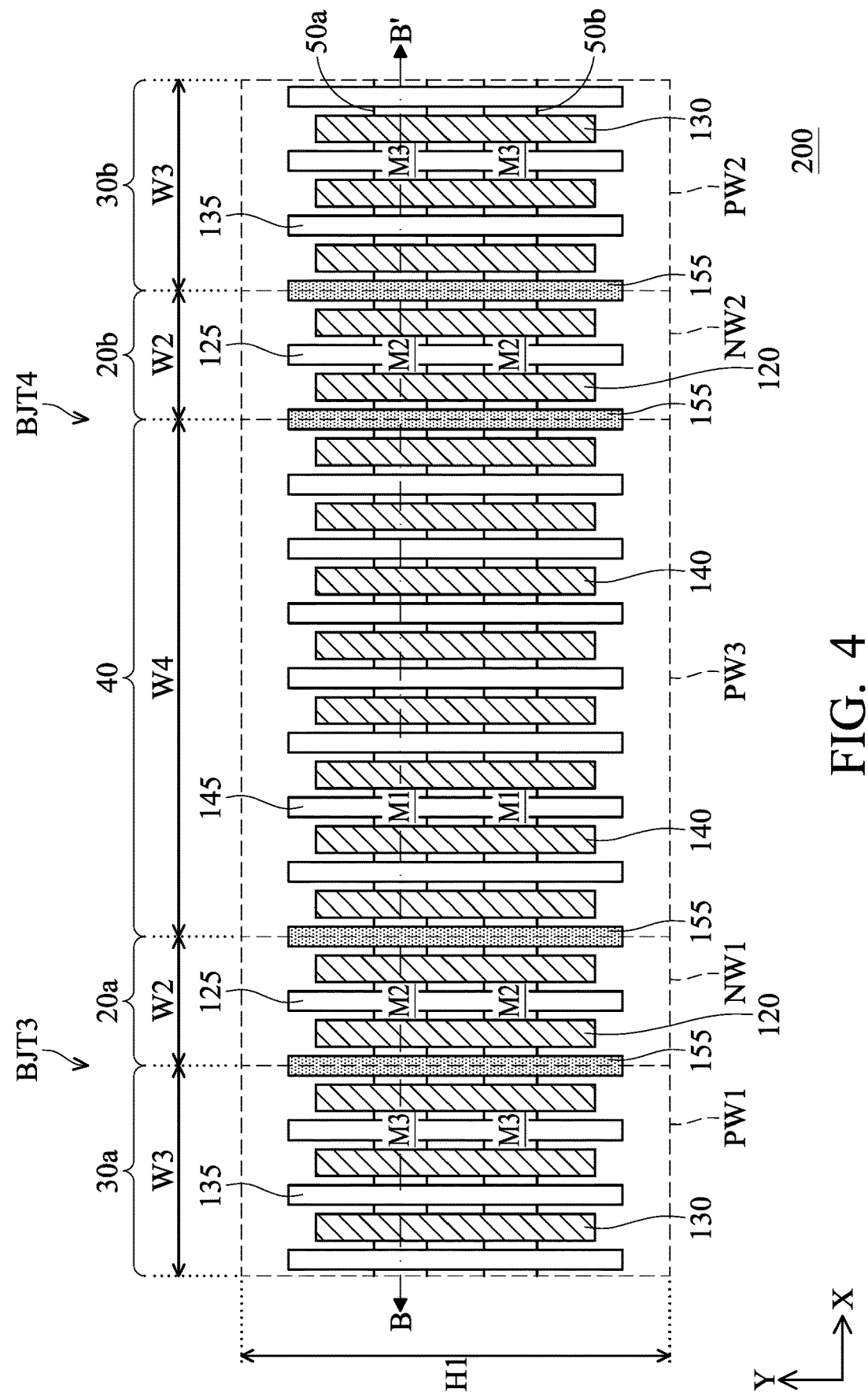
FIG. 4 shows a top view of a BJT structure according to some embodiments of the invention.

FIG. 4 shows a top view of a BJT structure 200 according to some embodiments of the invention. The BJT structure 200 is a symmetrical structure including the lateral PNP BJT devices BJT3 and BJT4. The BJT device BJT3 is formed in a fourth device region 40, a second device region 20a and a third device region 30a, and the BJT device BJT4 is formed in the fourth device region 40, a second device region 20b and a third device region 30b.

The second device regions 20a and 20b are formed over the N-type well regions NW1 and NW2, respectively. The fourth device region 40 is formed over the P-type well region PW3, and the third device regions 30a and 30b are formed over the P-type well regions PW1 and PW2, respectively. The fourth device region 40, the second device regions 20a and 20b and the third device regions 30a and 30b are arranged in the same row. The second device region 20a is disposed between the fourth device region 40 and the third device region 30a, and the second device region 20b is disposed between the fourth device region 40 and the third device region 30b. In the Y-direction, the fourth device region 40, the second device regions 20a and 20b and the third device regions 30a and 30b have the same height H1. In the X-direction, the fourth device region 40 has the weight W4, the second device regions 20a and 20b have the same weight W2, and the third device regions 30a and 30b have the same weight W3. In FIG. 4, the weight W3 is greater than the weight W2 and less than the weight W4, i.e., W2<W3<W4. In some embodiments, the weight W4 is greater than twice the weight W2 or W3.

The OD regions 50a and 50b extend in the X-direction. Each of the OD regions 50a and 50b, sometimes labeled as an "oxide diffusion" area, defines an active region for the transistors M1, M2 and M3, i.e., the region where the source, drain and channel under the gate of transistors M1, M2 and M3 are formed. The active region is defined to be between inactive areas, such as shallow trench isolation (STI) or field oxide (FOX) region. In some embodiments, the transistors M1 are P-type gate-all-around (GAA) field-effect transistors formed in the fourth device region 40. The transistors M2 are N-type GAA field-effect transistors formed in the second device region 20a and 20b. The transistors M3 are P-type GAA field-effect transistors formed in the third device regions 30a and 30b. Compared with the transistors M1 in the BJT structure 100 of FIG. 1, the transistors M1 of the BJT structure 200 are formed over the P-type well region PW3. Furthermore, the N-type well regions NW1 and NW2 are separated by the P-type well region PW3. In the BJT structure 200, the configuration of the gate structures 115, 125 and 135 and the connecting features 110, 120 and 130 are similar with that of the BJT structure 100. In some embodiments, the number of transistors M1 is greater than the number of transistors M3, and the number of transistors M3 is greater than the number of transistors M2.

In some embodiments, gates (e.g., the gate structures) of the transistors M1, M2 and M3 are floating. In some embodiments, the gates, sources and drains (e.g., source/drain features) of the transistors M1 are electrically connected together, the gates, sources and drains of the transistors M2 are electrically connected together, and the gates, sources and drains of the transistors M3 are electrically connected together. In some embodiments, the gates of the transistors M1 are electrically connected to the sources and drains of the transistors M2.

Figure 5:
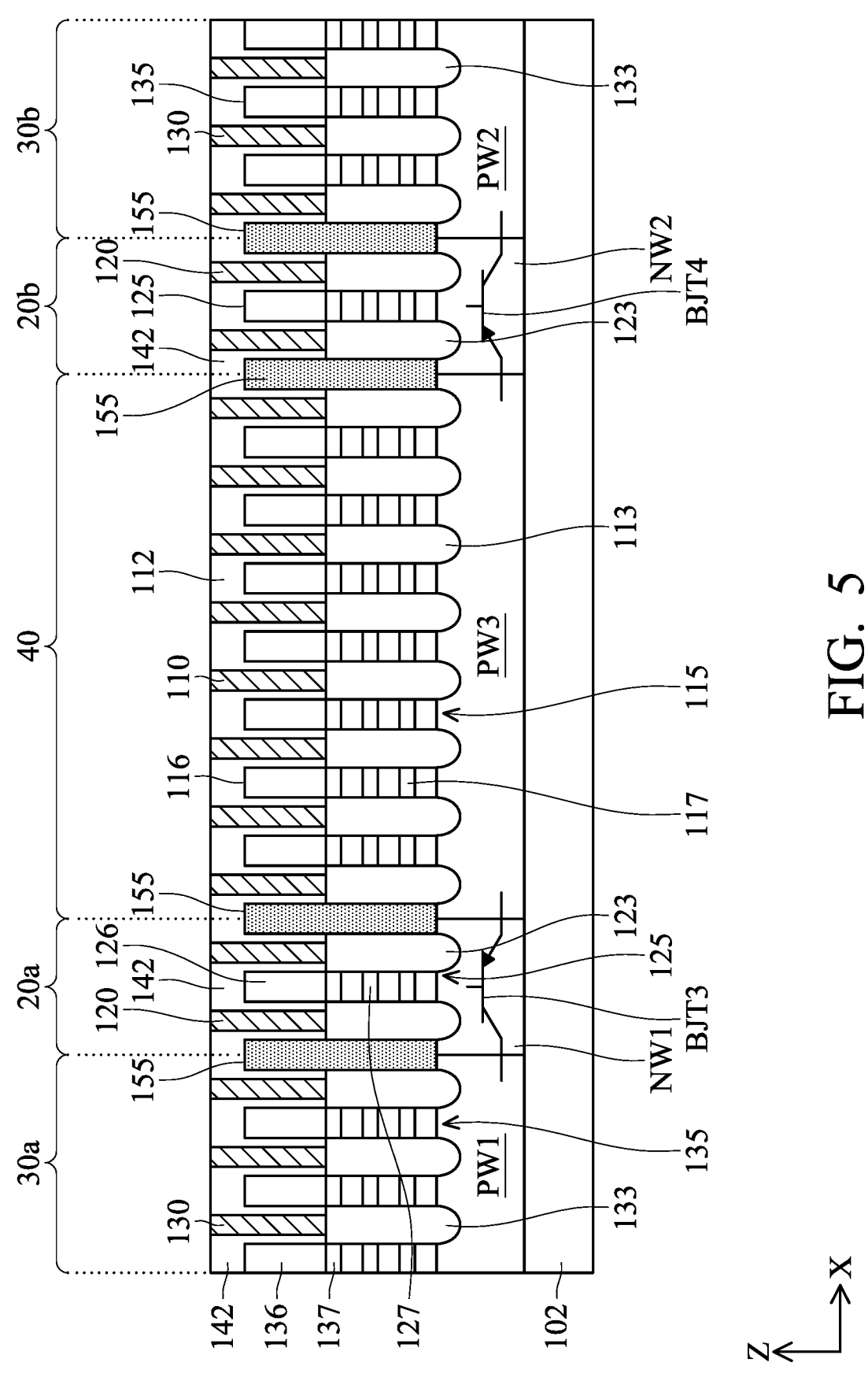
FIG. 5 shows a cross-sectional view of the BJT structure along line B-B' of FIG. 4 according to some embodiments of the invention.

FIG. 5 shows a cross-sectional view of the BJT structure 200 along line B-B' of FIG. 4 according to some embodiments of the invention. The P-type well regions PW1 through PW3 and the N-type well regions NW1 and NW2 are formed over the dielectric layer 102. The P-type well region PW1 is separated from the P-type well region PW3 by the N-type well region NW1, and the P-type well region PW2 is separated from the P-type well region PW3 by the N-type well region NW2. In some embodiments, the dielectric layer 102 includes Oxide, the P-type well regions PW1 through PW3 include boron-doped silicon (SiB), and the N-type well regions NW1 and NW2 include phosphorous-doped silicon (SiP). The dielectric layer 102 is formed by removing a substrate with a suitable process (e.g., a chemical mechanical polishing (CMP) process) after the transistors M1, M2 and M3 are formed.

The transistors M3 are formed over the P-type well regions PW1 and PW2. The gate structures 135 of the transistor M3 include the gate electrodes 136 and the nanostructures 137. Two source/drain features 133 are on opposite sides of each gate structure 135. The connecting features 130 are formed over and in contact with the source/drain features 133. The source/drain features 133 of the transistors M3 are electrically connected together through the connecting features 130 and the corresponding front-side interconnect structure (not shown). The connecting features 130 are separated from each other by the dielectric feature 142.

The transistors M2 are formed over the N-type well regions NW1 and NW2. The gate structures 125 of the transistor M2 include the gate electrodes 126 and the nanostructures 127. The source/drain features 123 of the transistors M2 are formed by epitaxially-grown materials. Two source/drain features 123 are on opposite sides of each gate structure 125. The connecting features 120 are formed over and in contact with the source/drain features 123. The source/drain features 123 of the transistors M2 are electrically connected together through the connecting features 120 and the corresponding interconnect structure (not shown). The connecting features 120 are separated from each other by the dielectric feature 142.

The transistors M1 are formed over the P-type well regions PW3. The gate structures 115 of the transistor M1 include the gate electrodes 116 and the nanostructures 117. The source/drain features 113 of the transistors M1 are formed by epitaxially-grown materials. Two source/drain features 113 are on opposite sides of each gate structure 115. The connecting features 110 are formed over and in contact with the source/drain features 113. The source/drain features 113 of the transistors M1 are electrically connected together through the connecting features 110 and the corresponding front-side interconnect structure (not shown). The connecting features 110 are separated from each other by the dielectric feature 142.

In FIG. 5, the transistors M1 of the fourth device region 40 are separated from the transistors M2 of the second device region 20a by the dielectric-base gate structures 155 overlapping the interface between the N-type well region NW1 and the P-type well region PW3. The transistors M1 of the fourth device region 40 are separated from the transistors M2 of the second device region 20b by the dielectric-base gate structures 155 overlapping the interface between the N-type well region NW2 and the P-type well region PW3. Moreover, the transistor M2 of the second device region 20a are separated from the transistors M3 of the third device region 30a by the dielectric-base gate structures 155 overlapping the interface between the P-type well region PW1 and the N-type well region NW1. The transistor M2 of the second device region 20b are separated from the transistors M3 of the third device region 30b by the dielectric-base gate structures 155 overlapping the interface between the P-type well region PW2 and the N-type well region NW2.

In the BJT structure 200, the emitter region of the BJT device BJT3 is formed by the P-type well region, the base region of the BJT device BJT3 is formed by the N-type well region NW1, and the collector region of the BJT device BJT3 is formed by the P-type well region PW1. One PN junction of the BJT device BJT3 is formed between the P-type well region PW3 and the N-type well region NW1, and another PN junction of the BJT device BJT3 is formed between the N-type well region NW1 and the P-type well region PW1.

The emitter region of the BJT device BJT4 is formed by the P-type well region PW3, the base region of the BJT device BJT4 is formed by the N-type well region NW2, and the collector region of the BJT device BJT4 is formed by the P-type well region PW2. One PN junction of the BJT device BJT4 is formed between the P-type well region PW3 and the N-type well region NW2, and another PN junction of the BJT device BJT4 is formed between the N-type well region NW2 and the P-type well region PW2.

In FIG. 5, the emitter regions of the BJT devices BJT3 and BJT4 are simultaneously coupled to the corresponding circuit through the connecting features 110 and a first front-side interconnect structure (not shown). The base regions of the BJT devices BJT3 and BJT4 are simultaneously coupled to the corresponding circuit through the connecting features 120 and a second front-side interconnect structure (not shown). The collector regions of the BJT devices BJT3 and BJT4 are simultaneously coupled to the corresponding circuit through the connecting features 130 and a third front-side interconnect structure (not shown).

In some embodiments, the emitter regions of the BJT devices BJT3 and BJT4 are further electrically connected to the corresponding circuit through the back-side connecting features (e.g., the connecting features 162 and 172) and a first back-side interconnect structure (not shown). The base regions of the BJT devices BJT3 and BJT4 are further electrically connected to the corresponding circuit through the back-side connecting features (not shown) and a second back-side interconnect structure (not shown). The collector regions of the BJT devices BJT3 and BJT4 are further electrically connected to the corresponding circuit through the back-side connecting features (e.g., the connecting features 166 and 176) and a third back-side interconnect structure (not shown).

Compared with the emitter regions (formed by the source/drain features 113) of the BJT devices BJT1 and BJT2 in the BJT structure 100 of FIG. 1, the emitter regions of the BJT devices BJT3 and BJT4 in the BJT structure 200 are formed by the P-type well region with lower energy level, thereby the BJT devices BJT3 and BJT4 have high beta (0) and better Vbe mismatch. Therefore, the BJT devices BJT3 and BJT4 of the BJT structure 200 are used in the circuits for low-power applications, and the BJT devices BJT1 and BJT2 of the BJT structure 100 are used in the circuits for high-power applications.

Compared with the conventional BJT structure that Si substrate is polished for back-side power or back-side interconnect, the BJT structures 100 and 200 provide the lateral BJT devices. When the lateral BJT device is operated, the electric holes are transported from the emitter region to the collector region for GAA structure.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bipolar junction transistor (BJT) structure, comprising:

a dielectric layer;

a first well region formed over the dielectric layer;

a second well region formed over the dielectric layer, wherein the second well region is in contact with the first well region;

a plurality of first gate-all-around (GAA) field-effect transistors formed over the first well region;

a plurality of second GAA field-effect transistors formed over the first well region; and a plurality of third GAA field-effect transistors formed over the second well region, wherein source/drain features of the first and third GAA field-effect transistors and the second well region have a first conductivity type, and source/drain features of the second GAA field-effect transistors and the first well region have a second conductivity type that is different from the first conductivity type, wherein a first PN junction of a first BJT device is formed between the source/drain features of the first GAA field-effect transistors and the first well region, and a second PN junction of the first BJT device is formed between the first well region and the second well region;

wherein the number of the first GAA field-effect transistors is greater than the number of the third GAA field-effect transistors, and the number of the third GAA field-effect transistors is greater than the number of the second GAA field-effect transistors.

2. The BJT structure as claimed in claim 1, wherein the first, second and third GAA field-effect transistors are arranged in a line along a first direction, and gate structures of the first, second and third GAA field-effect transistors extend in a second direction that is perpendicular to the first direction, wherein the second GAA field-effect transistors are disposed between the first and third GAA field-effect transistors.

3. The BJT structure as claimed in claim 1, wherein the second GAA field-effect transistors are separated from the first GAA field-effect transistors by a dielectric-base gate structure, and the dielectric-base gate structure overlaps the first well region.

4. The BJT structure as claimed in claim 1, wherein the second GAA field-effect transistors are separated from the third GAA field-effect transistors by a dielectric-base gate structure, and the dielectric-base gate structure overlaps an interface between the first and second well regions.

5. The BJT structure as claimed in claim 1, wherein the source/drain features of the first GAA field-effect transistors are electrically connected together through a first front-side interconnect structure, the source/drain features of the second GAA field-effect transistors are electrically connected together through a second front-side interconnect structure, and the source/drain features of the third GAA field-effect transistors are electrically connected together through a third front-side interconnect structure.

6. The BJT structure as claimed in claim 5, wherein the source/drain features of the first GAA field-effect transistors are further electrically connected together through a first back-side interconnect structure, the source/drain features of the second GAA field-effect transistors are further electrically connected together through a second back-side interconnect structure, and the source/drain features of the third GAA field-effect transistors are further electrically connected together through a third back-side interconnect structure.

7. The BJT structure as claimed in claim 1, further comprising:

a third well region formed over the dielectric layer;

a plurality of fourth GAA field-effect transistors formed over the first well region; and a plurality of fifth GAA field-effect transistors formed over the third well region, wherein the first well region is disposed between the second and third well regions, wherein source/drain features of the fifth GAA field-effect transistors and the third well region have the first conductivity type, and source/drain features of the fourth GAA field-effect transistors have the second conductivity type.

8. The BJT structure as claimed in claim 7, wherein a third PN junction of a second BJT device is formed between the source/drain features of the first GAA field-effect transistors and the first well region, and a fourth PN junction of the second BJT device is formed between the third well region and the first well region.

9. The BJT structure as claimed in claim 1, wherein gates of the first, second and third GAA field-effect transistors are floating.

10. A bipolar junction transistor (BJT) structure, comprising:

a dielectric layer;

a first well region formed over the dielectric layer;

a second well region formed over the dielectric layer;

a third well region formed over the dielectric layer, wherein the second well region is disposed between the first and third well regions;

a plurality of first gate-all-around (GAA) field-effect transistors formed over the first well region, wherein source/drain features of the first GAA field-effect transistors are electrically connected together;

a plurality of second GAA field-effect transistors formed over the second well region, wherein source/drain features of the second GAA field-effect transistors are electrically connected together; and a plurality of third GAA field-effect transistors formed over the third well region, wherein source/drain features of the third GAA field-effect transistors are electrically connected together, wherein the source/drain features of the first and third GAA field-effect transistors and the first and third well regions have a first conductivity type, and the source/drain features of the second GAA field-effect transistors and the second well region have a second conductivity type that is different from the first conductivity type, wherein a first PN junction of a first BJT device is formed between the first and second well regions, and a second PN junction of the first BJT device is formed between the second and third well regions;

wherein the number of the first GAA field-effect transistors is greater than the number of the third GAA field-effect transistors, and the number of the third GAA field-effect transistors is greater than the number of the second GAA field-effect transistors.

11. The BJT structure as claimed in claim 10, wherein the first, second and third GAA field-effect transistors are arranged in a line along a first direction, and gate structures of the first, second and third GAA field-effect transistors extend in a second direction that is perpendicular to the first direction, wherein the second GAA field-effect transistors are disposed between the first and third GAA field-effect transistors.

12. The BJT structure as claimed in claim 10, wherein the second GAA field-effect transistors are separated from the first GAA field-effect transistors by a dielectric-base gate structure, and the dielectric-base gate structure overlaps an interface between the first and second well regions.

13. The BJT structure as claimed in claim 10, wherein the second GAA field-effect transistors are separated from the third GAA field-effect transistors by a dielectric-base gate structure, and the dielectric-base gate structure overlaps an interface between the second and third well regions.

14. The BJT structure as claimed in claim 10, wherein the source/drain features of the first GAA field-effect transistors are electrically connected together through a first front-side interconnect structure, the source/drain features of the second GAA field-effect transistors are electrically connected together through a second front-side interconnect structure, and the source/drain features of the third GAA field-effect transistors are electrically connected together through a third front-side interconnect structure.

15. The BJT structure as claimed in claim 14, wherein the source/drain features of the first GAA field-effect transistors are further electrically connected together through a first back-side interconnect structure, the source/drain features of the second GAA field-effect transistors are further electrically connected together through a second back-side interconnect structure, and the source/drain features of the third GAA field-effect transistors are further electrically connected together through a third back-side interconnect structure.

16. The BJT structure as claimed in claim 10, further comprising:

a fourth well region formed over the dielectric layer;

a fifth well region formed over the dielectric layer;

a plurality of fourth GAA field-effect transistors formed over the fourth well region; and a plurality of fifth GAA field-effect transistors formed over the fifth well region, wherein the first well region is disposed between the second and fourth well regions, and the fourth well region is disposed between the first and fifth well regions, wherein source/drain features of the fourth GAA field-effect transistors and the fourth well region have the second conductivity type, and source/drain features of the fifth GAA field-effect transistors and the fifth well region have the first second-conductivity type.

17. The BJT structure as claimed in claim 16, wherein a third PN junction of a second BJT device is formed between the first and fourth well regions, and a fourth PN junction of the second BJT device is formed between the fourth and fifth well regions.

18. The BJT structure as claimed in claim 10, wherein gates of the first, second and third GAA field-effect transistors are floating.

\* \* \* \* \*